(12) United States Patent
Ling et al.

(10) Patent No.: US 9,621,199 B2
(45) Date of Patent: *Apr. 11, 2017

(54) POWER COMBINING POWER AMPLIFIER ARCHITECTURES AND METHODS

(71) Applicant: MaxLinear, Inc., Carlsbad, CA (US)

(72) Inventors: Curtis Ling, Carlsbad, CA (US); Leonard Dauphinee, Irvine, CA (US); Rahul Bhatia, San Marcos, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/868,722

(22) Filed: Sep. 29, 2015

(65) Prior Publication Data

US 2016/0020790 A1  Jan. 21, 2016

Related U.S. Application Data

(63) Continuation of application No. 14/510,974, filed on Oct. 9, 2014, now Pat. No. 9,148,182.

(Continued)

(51) Int. Cl.
*H04L 25/49* (2006.01)
*H04B 1/04* (2006.01)
(Continued)

(52) U.S. Cl.
CPC ......... *H04B 1/0475* (2013.01); *H04B 1/0483* (2013.01); *H04B 17/10* (2015.01);
(Continued)

(58) Field of Classification Search
CPC .............. H04B 1/0475; H04B 17/0025; H04B 2001/045; H04B 17/13; H04B 17/14; H04B 17/10; H04B 1/0483; H04L 25/08
See application file for complete search history.

(56) References Cited

U.S. PATENT DOCUMENTS

| | | | |
|---|---|---|---|
| 2006/0115010 A1* | 6/2006 | Rog | ................... H04L 27/2618 375/260 |
| 2007/0232246 A1* | 10/2007 | Lozhkin | .................. H03C 5/00 455/108 |

(Continued)

*Primary Examiner* — Syed Haider
(74) *Attorney, Agent, or Firm* — McAndrews, Held & Malloy, Ltd.

(57) ABSTRACT

Systems and methods are provided for implementing and using multiband transceivers. In a transmitter that comprises a plurality of transmit paths, a frequency spectrum that is used for transmission may be assigned to the plurality of transmit paths. Performance in each of the plurality of transmit paths may be monitored during transmission of signals, and based on the monitored performance, at least one of segmentation of the frequency spectrum and assignment of the segments to the plurality of transmit paths may be dynamically modified. Performance monitoring may be based on spectrum usage, peak to average power ratio (PAPR), and/or performance related criteria (e.g., threshold, timeout duration, etc.). Modifying operation of a transmit path may comprise disabling or enabling that transmit path. The frequency spectrum may be segmented such that each of the segments is uniformly sized, or such that at least one of the segments is sized differently.

17 Claims, 15 Drawing Sheets

Related U.S. Application Data

(60) Provisional application No. 61/888,963, filed on Oct. 9, 2013.

(51) Int. Cl.
| | | |
|---|---|---|
| *H04B 17/10* | (2015.01) | |
| *H04B 17/13* | (2015.01) | |
| *H04B 17/14* | (2015.01) | |
| *H04L 25/08* | (2006.01) | |

(52) U.S. Cl.
CPC ............ *H04B 17/13* (2015.01); *H04B 17/14* (2015.01); *H04L 25/08* (2013.01); *H04B 2001/045* (2013.01)

(56) References Cited

U.S. PATENT DOCUMENTS

| | | | |
|---|---|---|---|
| 2008/0285673 A1* | 11/2008 | Han | H04L 27/2621 375/260 |
| 2009/0184763 A1 | 7/2009 | Kim | |
| 2010/0034311 A1* | 2/2010 | Hasegawa | H04L 5/0007 375/267 |
| 2011/0176622 A1* | 7/2011 | Higashinaka | H04J 11/0033 375/259 |
| 2013/0129017 A1* | 5/2013 | Sahin | H04L 27/00 375/296 |

\* cited by examiner

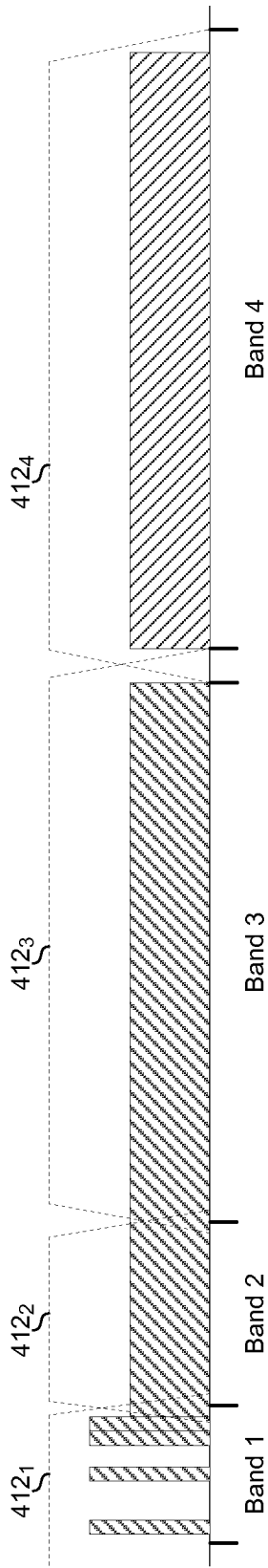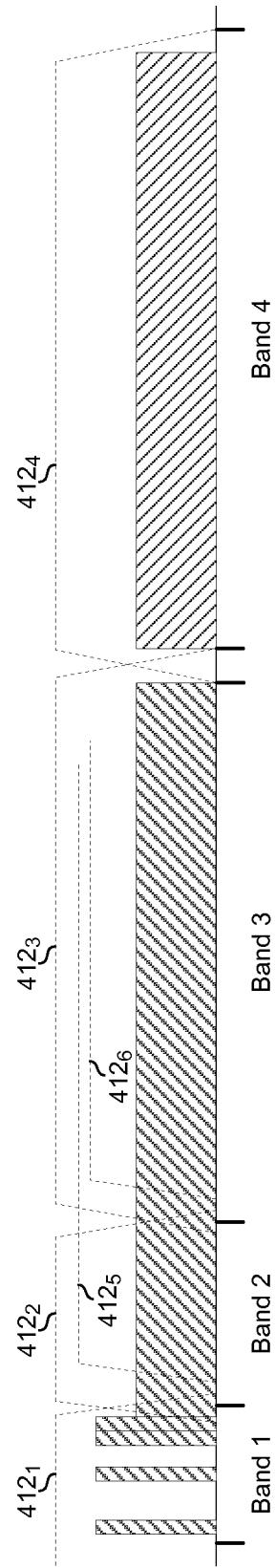
FIG. 8A
FIG. 8B

POWER COMBINING POWER AMPLIFIER ARCHITECTURES AND METHODS

CLAIM OF PRIORITY

This application is a continuation of U.S. patent application Ser. No. 14/510,974, filed Oct. 9, 2014, which in turn makes reference to, claims priority to and claims benefit from U.S. Provisional Patent Application Ser. No. 61/888,963, filed Oct. 9, 2013. Each of the above identified application is hereby incorporated herein by reference in its entirety.

TECHNICAL FIELD

Aspects of the present disclosure relate to electronics. More specifically, certain implementations of the present disclosure relate to methods and systems for power combining power amplifier architectures and methods.

BACKGROUND

Conventional power amplifier architectures and methods can be inefficient. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for power combining power amplifier architectures and methods, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 8A depicts an example allocation of spectrum among paths of the transceivers shown in FIGS. 7A-7C.

FIG. 8B depicts an example allocation of spectrum among transmit and receive paths of the transceivers shown in FIG. 7D.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting. Further, although the following description uses DOCSIS (Data Over Cable Service Interface Specification) based transmitters/receivers and network as an example use case, various aspects of this disclosure may be used in wired and wireless transmitters and networks of all kinds.

Figure 1:
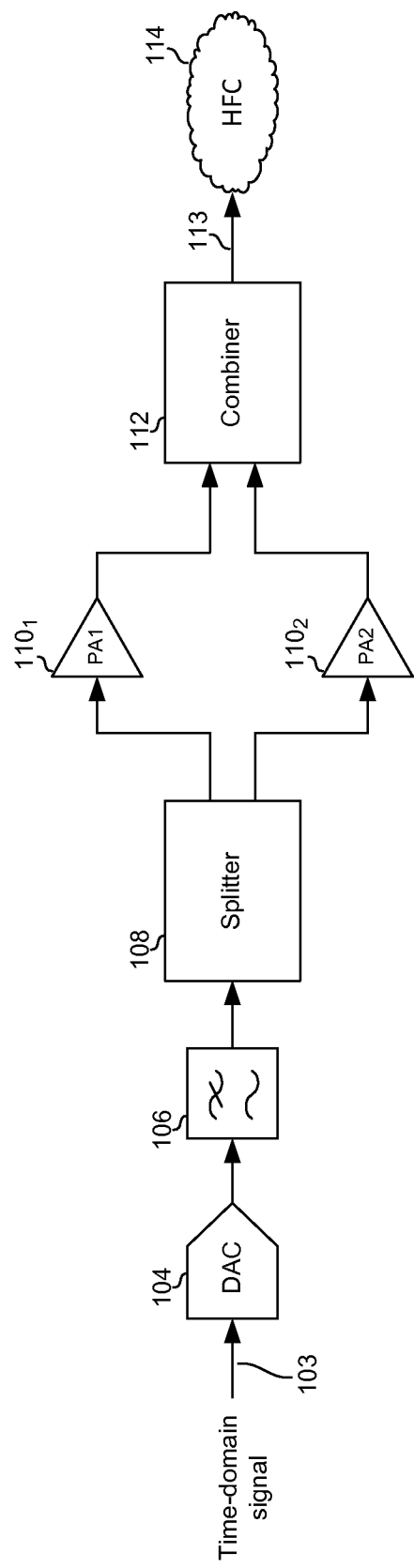
FIG. 1 depicts a portion of an example transmitter comprising multiple power amplifiers operating in parallel.

FIG. 1 depicts a portion of an example transmitter comprising multiple power amplifiers operating in parallel. The depicted portion of the transmitter may comprise a digital-to-analog converter (DAC) circuit 104, a filter circuit 106, a splitter circuit 108, power amplifier circuits $110_1$ and $110_2$, and a combiner circuit 112.

In the example implementation shown in FIG. 1, the transmitter transmits (e.g., signal 113) into a hybrid-fiber coaxial (HFC) network 114. The transmitter may be part of a DOCSIS modem or cable modem termination system (CMTS). Using multiple power amplifiers (PAs) in parallel, as shown in FIG. 1, may improve heat dissipation and maximum output power of the transmitter relative to using only a single PA.

In operation, a time-domain digital signal 103 may be converted by DAC 104 to an analog signal, which may be filtered by filter 106 and then split by the splitter 108 into two substantially identical signals, each of which may be amplified by a respective one of PAs $110_1$ and $110_2$. The amplified outputs may then be recombined in combiner 112.

In another example implementation, the combiner 112 may be replaced by a circulator, which may be less lossy than a passive implementation of combiner 112.

Figure 2A:
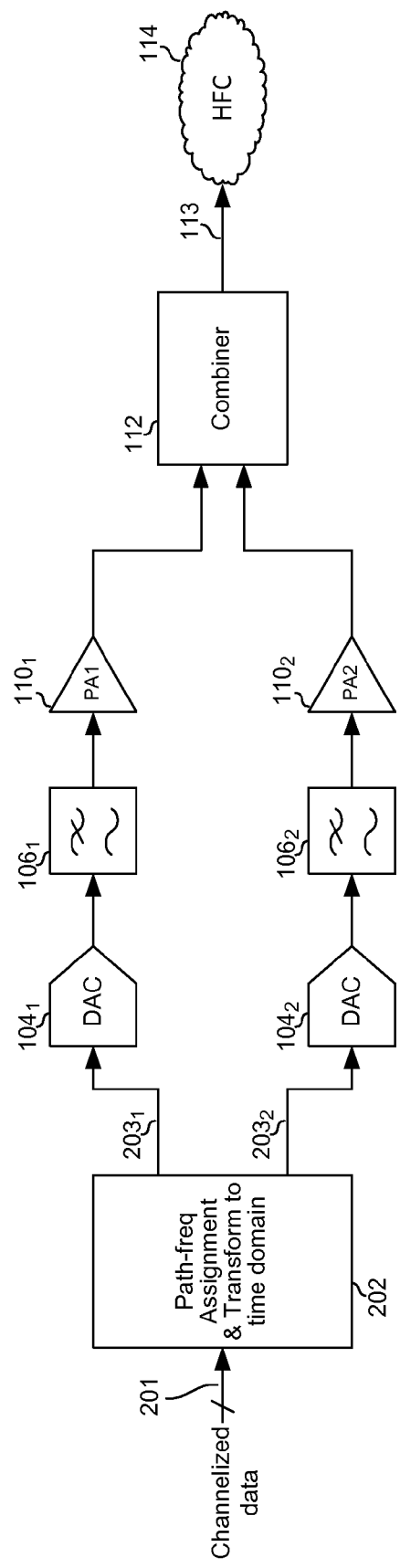
FIGS. 2A-2C depict portions of example transmitters operable to dynamically allocate frequency segments among a plurality of transmit paths operating in parallel.
Figure 2B:
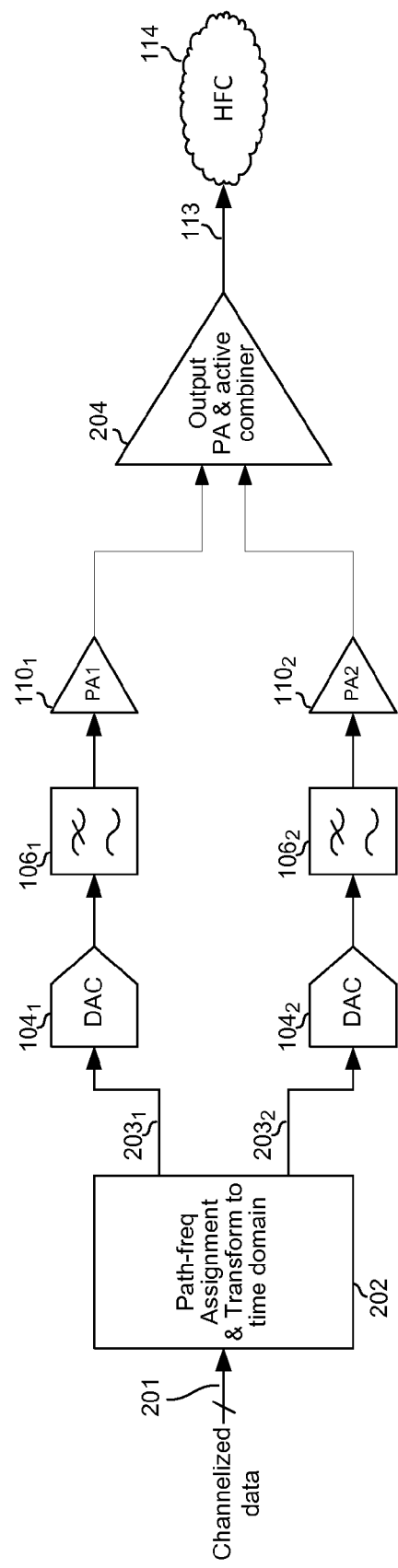
Figure 2C:
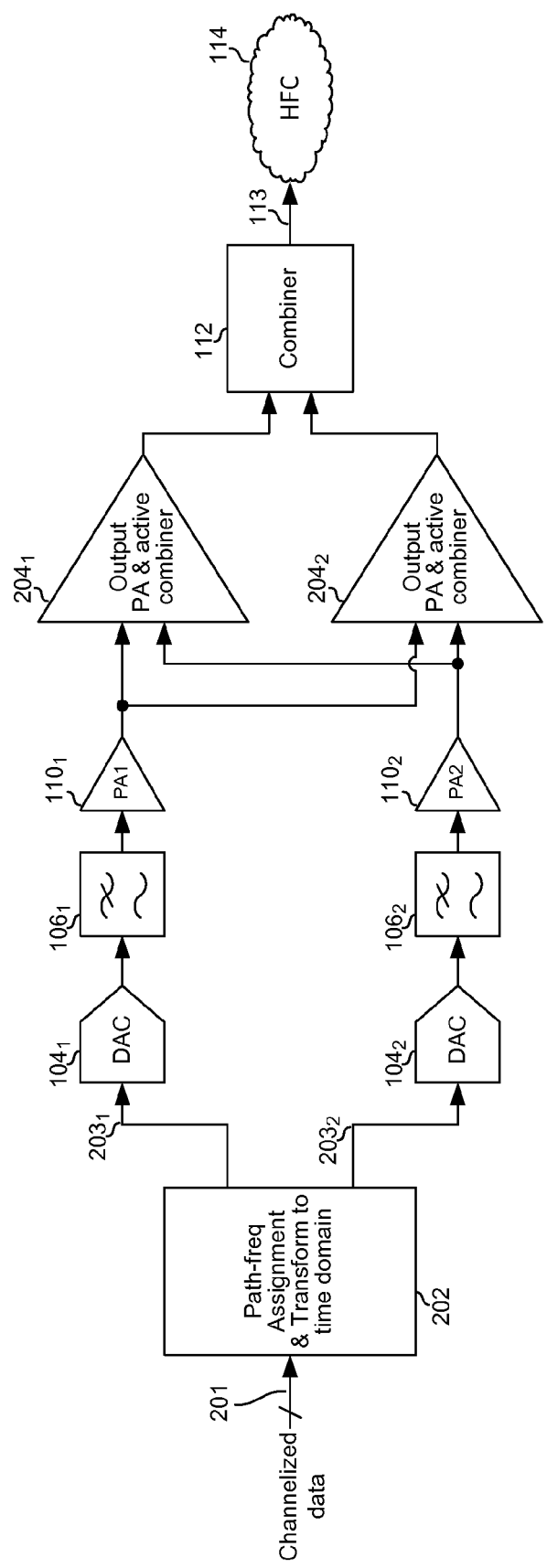

FIGS. 2A-2C depict portions of example transmitters operable to dynamically allocate frequency segments among a plurality of transmit paths operating in parallel. For example, shown in FIG. 2A is a portion of a transmitter, which may have parallel PAs like the transmitter shown in FIG. 1. However, the transmitter (or portion thereof) shown in FIG. 2A may additionally have parallel DACs $104_1$ and $104_2$ and parallel filters $106_1$ and $106_2$ as well as a path assignment circuit 202. The path assignment circuit 202 may comprise suitable circuitry for assigning signals, corresponding to one or more input signals into the path assignment circuit 202, onto a plurality of paths (e.g., a plurality of transmit paths within a transmitter). For example, the path assignment circuit 202 may comprise suitable circuitry to dynamically allocate frequency segments among a plurality of transmit paths based on peak to average power ratio (PAPR). An example implementation of the path assignment circuit 202 is described in more detail in FIG. 2D.

In operation, X (an integer) time-domain signals 201 (e.g., carriers modulated in accordance with DOCSIS 3.0) and/or frequency-domain signals (e.g., OFDM subcarriers modulated in accordance with DOCSIS 3.1) may arrive at the path assignment circuit 202. The path assignment circuit 202 may divide the transmit frequency spectrum into a plurality of segments and then, for each of the plurality of frequency segments, assign the carriers and/or subcarriers falling within that segment to one of a plurality of transmit paths within the transmitter. For example, the path assignment circuit 202 may assign (via signals $203_1$, $203_2$) the carriers and/or subcarriers falling within a particular segment to either transmit path 1 (comprising DAC $104_1$, filter $106_1$, and PA $110_1$) or transmit path 2 (comprising DAC $104_2$, filter $106_2$, and PA $110_2$). The outputs of the transmit paths 1 and 2 may be recombined by the combiner 112.

In an example implementation, the use of two PAs in parallel (as opposed to using a single PA) may reduce the number of carriers/subcarriers per PA, and may reduce the peak to average power ratio (PAPR) by, for example, ~1 to 2 dB. Further, the dynamic assignment of frequency segments among the multiple transmit paths may reduce PAPR by an additional 3 dB or more, for example.

In an example implementation, the assignments of each carrier and/or subcarrier to one of the two paths may be performed based on the PAPR of the signals $203_1$, $203_2$, and/or 113.

While the example implementation depicted in FIG. 2A (and similarly in FIGS. 2B-2C) comprises two transmit paths, it should be understood that the use of implementation with only two transmit path is for illustration, and that different number of transmit paths (and/or different manner for use thereof when assigning carriers and/or subcarriers) may be used. For example, other implementations may dynamically assign carriers and/or subcarriers to a subset of three or more transmit paths (e.g., each assigned to 1 of 3 paths, each assigned to 2 of 3 paths, each assigned to 1 of 4 paths, etc.).

In various implementations, the components of the transmitter shown in FIG. 2A may be realized in any combination of one or more integrated circuits and/or one or more discrete components residing on one or more printed circuit boards (PCBs). As just one example, the components to the left of the PAs $110_1$ and $110_2$ may reside on a first semiconductor (e.g., silicon) die, the PAs $110_1$ and $110_2$ may reside on a second and third, respectively, semiconductor (e.g., Gallium Arsenide) die, and the combiner 112 may reside on a fourth semiconductor die or be realized using discrete components (e.g., SMT resistors and/or capacitors).

Now referring to FIG. 2B, the transmitter portion shown therein may be similar to the one shown in FIG. 2A but an output power amplifier (PA) and active combiner circuit 204 instead of the passive combiner 112 of FIG. 2A. The active combiner circuit 204 may comprise suitable circuitry for combining a plurality of inputs, and also for applying additional adjustment, such as power amplification. The active combiner circuit 204 may reduce or eliminate losses that may be introduced by the passive combiner 112. One consideration for the circuit 204 in FIG. 2B is that it needs to be capable of supporting the full PAPR of signal 113. Accordingly, the transmitter shown in FIG. 2B may be operable to provide substantially similar handling of the time-domain signals 201 as described with respect to FIG. 2A (but with enhanced performance as result of the use of 'active' circuit 204 instead of the 'passive' combiner 112).

In various implementations, the components of the transmitter shown in FIG. 2B may be realized in any combination of one or more integrated circuits and/or one or more discrete components residing on one or more printed circuit boards (PCBs), for example as described with respect to transmitter shown in FIG. 2A. For example, the circuit 204 may reside on the same semiconductor die as one of the PAs $110_1$ and $110_2$, or may reside on its on semiconductor die.

Now referring to FIG. 2C, the transmitter portion shown therein may be similar to the one shown in FIG. 2B but may comprise two of the circuits 204 in parallel and feeding the combiner 112. The circuits $204_1$ and $204_2$, arranged in the manner shown in FIG. 2C, may generate substantially identical signals to drive the combiner 112. Each of the circuits $204_1$ and $204_2$ in FIG. 2C may need drive only half the power driven by circuit 204 in FIG. 2B. The implementation shown in FIG. 2C may spread the heat among two circuits $204_1$ and $204_2$ rather than just a single active combiner circuit 204.

In various implementations, the components of the transmitter shown in FIG. 2C may be realized in any combination of one or more integrated circuits and/or one or more discrete components residing on one or more printed circuit boards (PCBs). For example, the circuit $204_1$ may reside on the same semiconductor die as PA $110_1$, and the circuit $204_2$ may reside on the same semiconductor die as $110_2$.

For each of the transmitters shown in FIGS. 1-2C, the signal 113 may be standard-compliant (e.g., DOCSIS 3.0 and/or DOCSIS 3.1). Further, the dynamic assignment of subcarriers may be transparent to the receiver (e.g., a CMTS).

In various implementations, each of the transmitters shown in FIGS. 2A-2C may be operable to dynamically control power consumption by enabling and disabling transmit paths. For example, transmit paths may be enabled/disabled based on spectrum usage and/or PAPR. If the PAPR is below a determined threshold and/or the number of carriers/subcarriers being utilized is below a threshold (which may correlate to low PAPR), then one or more transmit paths may be disabled. The path(s) may be enabled upon the PAPR and/or usage rising above a determined threshold.

Figure 2D:
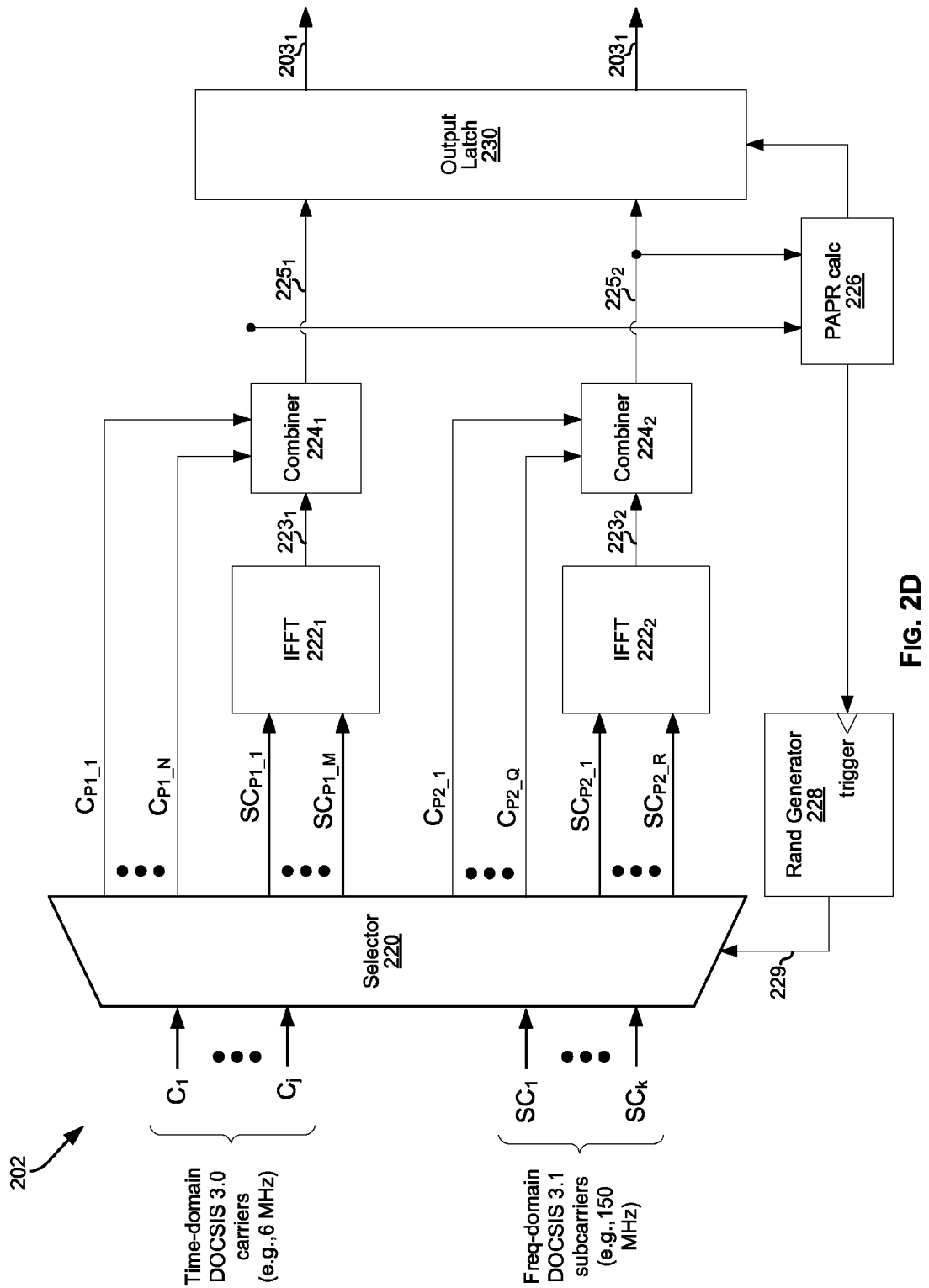
FIG. 2D depicts an example implementation of circuitry operable to dynamically allocate frequency segments among a plurality of transmit paths based on peak to average power ratio (PAPR).

FIG. 2D depicts an example implementation of circuitry operable to dynamically allocate frequency segments among a plurality of transmit paths based on peak to average power ratio (PAPR). Shown in FIG. 2D is an example implementation for the path assignment circuit 202 of FIGS. 2A-2C.

In the example implementation shown, inputs to the path assignment circuit 202 may be: (1) j (an integer) signals C, each corresponding to one of a respective j DOCSIS 3.0 upstream channels; and (2) k (an integer) signals SC, each corresponding to a respective one of k DOCSIS 3.1 subcarriers. The inputs may be applied to a circuit 220. The circuit 220 may select which N (an integer) of signals $C_1$-$C_j$ to output to a first transmit path (e.g., to a combiner circuit $224_1$) and which Q (an integer) of signals $C_1$-$C_j$ to output to a second transmit path (e.g., to a combiner circuit $224_2$). Similarly, the circuit 220 may select which M (an integer) of signals $SC_1$-$SC_k$ to output to a first transmit path (e.g., to an inverse fast Fourier transform (IFFT) circuit $222_1$) and which R (an integer) of signals $SC_1$-$SC_j$ to output to a second transmit path (e.g., to an IFFT circuit $222_2$).

The selections performed by the circuit 220 may be based on a control signal 229, which may be generated by a circuit 228. In the example implementation shown, the circuit 228 may be a random generator and the signal 229 may be a random number, and thus determining which signals are output to which transmit path may be random. In an example implementation, the random number may be constrained such that the number of signals, or percentage of spectrum, assigned to each transmit path may be a determined value or within a determined range of values (e.g., to ensure that signals occupying ~50% of the spectrum are routed to each of the transmit paths).

Each of the IFFT circuits $222_1$ and $222_2$ may be operable to transform the spectrum containing the respective assigned OFDM subcarriers from the frequency domain OFDM subcarriers to a respective one of time-domain signals $223_1$ and $223_2$.

The combiner circuit $224_1$ may be operable to combine the selected N time-domain signals with the time-domain signal $223_1$ to generate signal $225_1$. Similarly, the combiner circuit $224_2$ may be operable to combine the selected Q time-domain signals with the time-domain signal $223_2$ to generate signal $225_2$. The signals $225_1$ and $225_2$ may be output to an output latch circuit 230.

The circuit 226 may be operable to calculate the PAPR of the signals $225_1$ and $225_2$. Further, the circuit 226 may be operable to perform certain action under certain conditions based on the PAPR values. For example, if the PAPR values are below a threshold, then the circuit 225 may trigger the output latch circuit 230 to output the signals $225_1$ and $225_2$, as signals $203_1$ and $203_2$, respectively. If the PAPR values are above the threshold, the circuit 226 may trigger the circuit 228 to generate a new random value (new value for signal 229) resulting in a different mapping between the input signals and the transmit paths. This may be repeated, such as until a mapping with an acceptable PAPR is found or a timeout occurs for example.

Figure 3A:
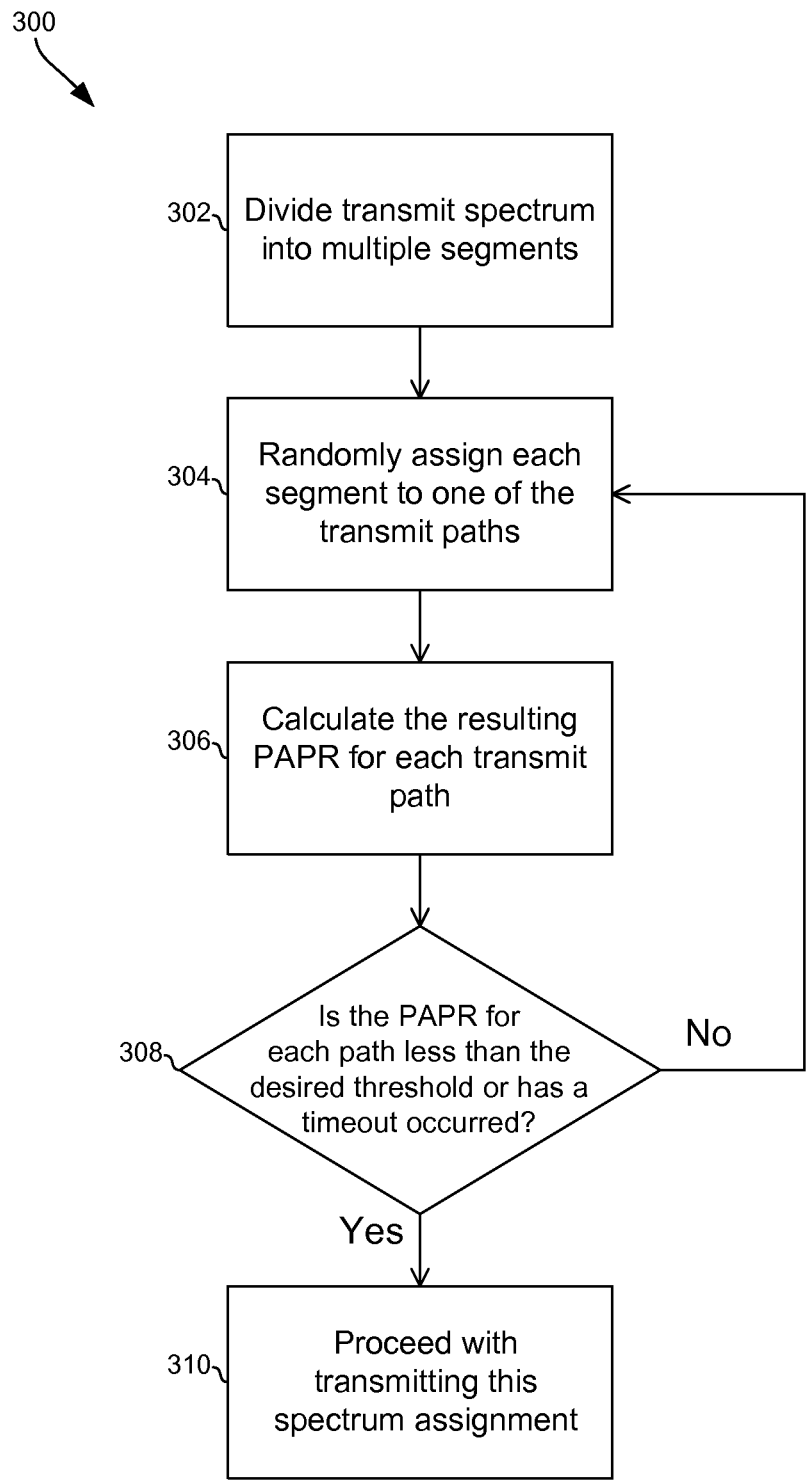
FIG. 3A depicts a flowchart of an example process for dynamically allocating frequency segments among a plurality of transmit paths based on peak to average power ratio (PAPR).

FIG. 3A depicts a flowchart of an example process for dynamically allocating frequency segments among a plurality of transmit paths based on peak to average power ratio (PAPR). Shown in FIG. 3A is a flow chart 300 comprising a plurality of steps (represented as blocks 302-310).

The example process begins with block 302 and proceeds to block 308. In block 302, transmit spectrum may be divided into multiple segments. In block 304, each segment may be randomly assign to one of the transmit paths. In block 306, the resulting PAPR for each transmit path may be calculated.

In block 308, a check may be performed to determine whether the PAPR for each path is less than the desired threshold or a timeout had occurred. If the result of block 308 is no, the process returns to block 304. If the result of block 308 is yes, the process may proceeds to block 310, to proceed with the transmitting based on the current spectrum assignment, thus completing the process. The process of block 3A may be executed for each transmit time interval.

Figure 3B:
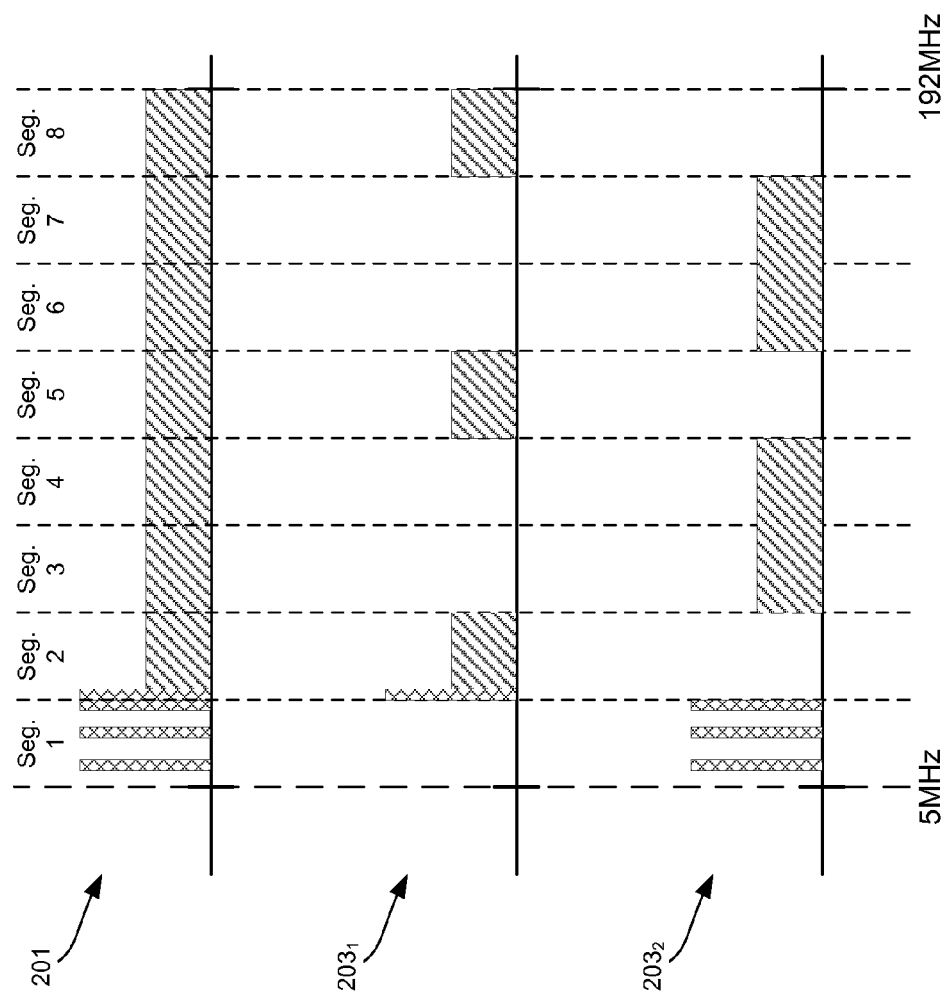
FIG. 3B depicts an example result of dynamic allocation of segments of DOCSIS upstream spectrum.

FIG. 3B depicts an example result of dynamic allocation of segments of DOCSIS upstream spectrum. In the example spectrum allocation shown in FIG. 3B, the spectrum (e.g., corresponding to signals 201 input into the path assignment circuit 202) may be divided into eight segments, which may or may not be uniformly sized (e.g., some segments may be wider than others). The segments may then be allocated among the transmit paths in the receiver. For example, in the particular example spectrum allocation shown in FIG. 3B, as a result of a random assignment of each of the eight segments, segments 2, 5, and 8 may be assigned to signals $203_1$ corresponding to transmit path 1, and segments 1, 3, 4, 6, and 7 may be assigned signals $203_1$ corresponding to transmit path 2. Thus, in the example implementation there is an uneven distribution of segments (5 vs. 3) and bandwidth (50% vs. 30%) among the two paths.

In some implementations, the distribution may be constrained to be 50% (or some other percentage, or within some range of percentages) of segments and/or 50% (or some other percentage, or within some range of percentages) of bandwidth.

Figure 4A:
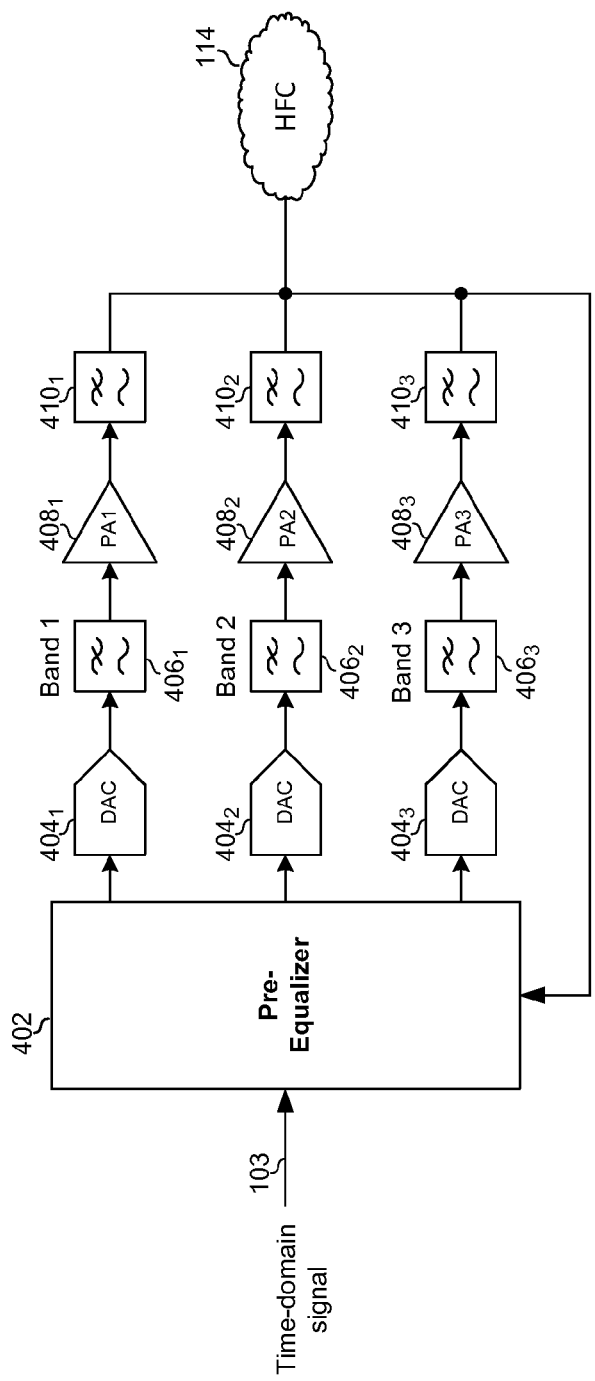
FIG. 4A depicts a portion of an example transmitter comprising multiple transmit paths for multiple DOCSIS upstream bands.

FIG. 4A depicts a portion of an example transmitter comprising multiple transmit paths for multiple DOCSIS upstream bands. For example, the transmitter (or portion thereof) shown in FIG. 4A may comprise a pre-equalizer 402, and a plurality of transmit paths (e.g., 3 transmit paths, as shown in the implementation depicted in FIG. 4A), with each of the transmit paths (transmit path 'i') comprising a DAC $404_i$, a first filter $406_i$, a PA $408_i$, and a second filter 410.

The architecture of FIG. 4A may enable dynamically reconfiguring the transmitter bandwidth without need for high-power switches in the analog domain. The elimination of such switches may reduce cost, board area, and power loss. Dividing the upstream spectrum among multiple paths may reduce the performance requirements of the components of the transmitter (e.g., DACs 404, filters 406, PAs 408, and filters 410 in the example implementation shown in FIG. 4A) of the paths relative to an implementation where each path has to handle more bandwidth (and likely more PAPR as a result).

One advantage of the transmitter architecture of FIG. 4A is that filtering for each transmit path may be broken into two filters, namely filter 406 and filter 410. Accordingly, the filters 406 may be readily integrated on chip with the DACs 404 whereas filters 410 may be off-chip components.

Figure 4B:
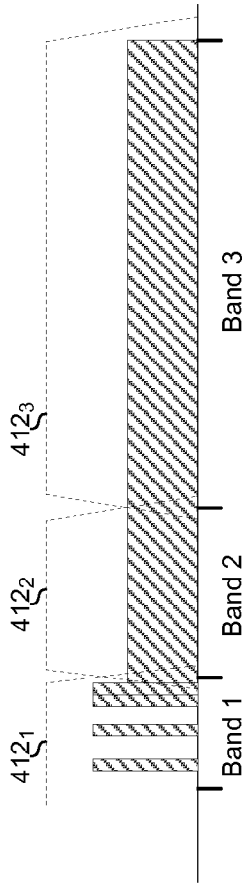
FIG. 4B depicts example allocation of spectrum among the transmit paths of the transmitter shown in FIG. 4A.

In some instances, due to non-idealities of the filters 406, there may be some overlap in their passbands (the overlaps may be referred to as "transition bands"). This is illustrated in the FIG. 4B, which depicts example allocation of spectrum among the transmit paths of the transmitter architecture shown in FIG. 4A. In this regard, the first transmit path may be allocated a first band $412_1$ ("Band 1"), the second transmit path may be allocated a second band $412_2$ ("Band 2"), and the third transmit path may be allocated a third band $412_3$ ("Band 3.")

In an example implementation, pre-equalizer 402 may be operable to compensate for the transition band roll-off and group delay variation. There may be a feedback path from the output (or some intermediate stage of one or more of the transmit paths) for adapting/calibrating the pre-equalization.

In an example implementation, the architecture of FIG. 4A may provide for suppression of harmonic distortion in the outputs of the PAs 408.

In an example implementation, the various transmit paths of the transmitter shown in FIG. 4A may be dynamically enabled/disabled as needed. For example, the first transmit path may be enabled only when the transmitter needs/desires to transmit on a first band (e.g., Band 1), the second transmit path may be enabled only when the needs/desires to transmit on a second band (e.g., Band 2), and the third transmit path may be enabled only when the needs/desires to transmit on a third band (e.g., Band 3).

In an example DOCSIS-based implementation, Band 1 may go up to 42 MHz, Band 2 may go up to 85 MHz, and Band 3 may go up to 192 MHz. In such an implementation, only the first path may be enabled when supporting DOCSIS 3.0 using a "low split," Bands 1 and 2 may be enabled when supporting DOCSIS 3.1 with a "mid split" or when supporting DOCSIS 3.0 below the low split and DOCSIS 3.1 between the low split and the mid split, and Bands 1, 2, and 3 may be enabled when supporting DOCSIS 3.1 with a "high split" or for concurrently supporting backwards compatibility for DOCSIS 3.0 when supporting DOCSIS 3.0 below the low split and DOCSIS 3.1 between the low split and the high split.

A transmitter may use the multiband architecture of FIG. 4A in combination with the dynamic path assignment circuit 202 described above with reference to 2A-3B. An example implementation of such a transmitter is shown in FIG. 5

Figure 5:
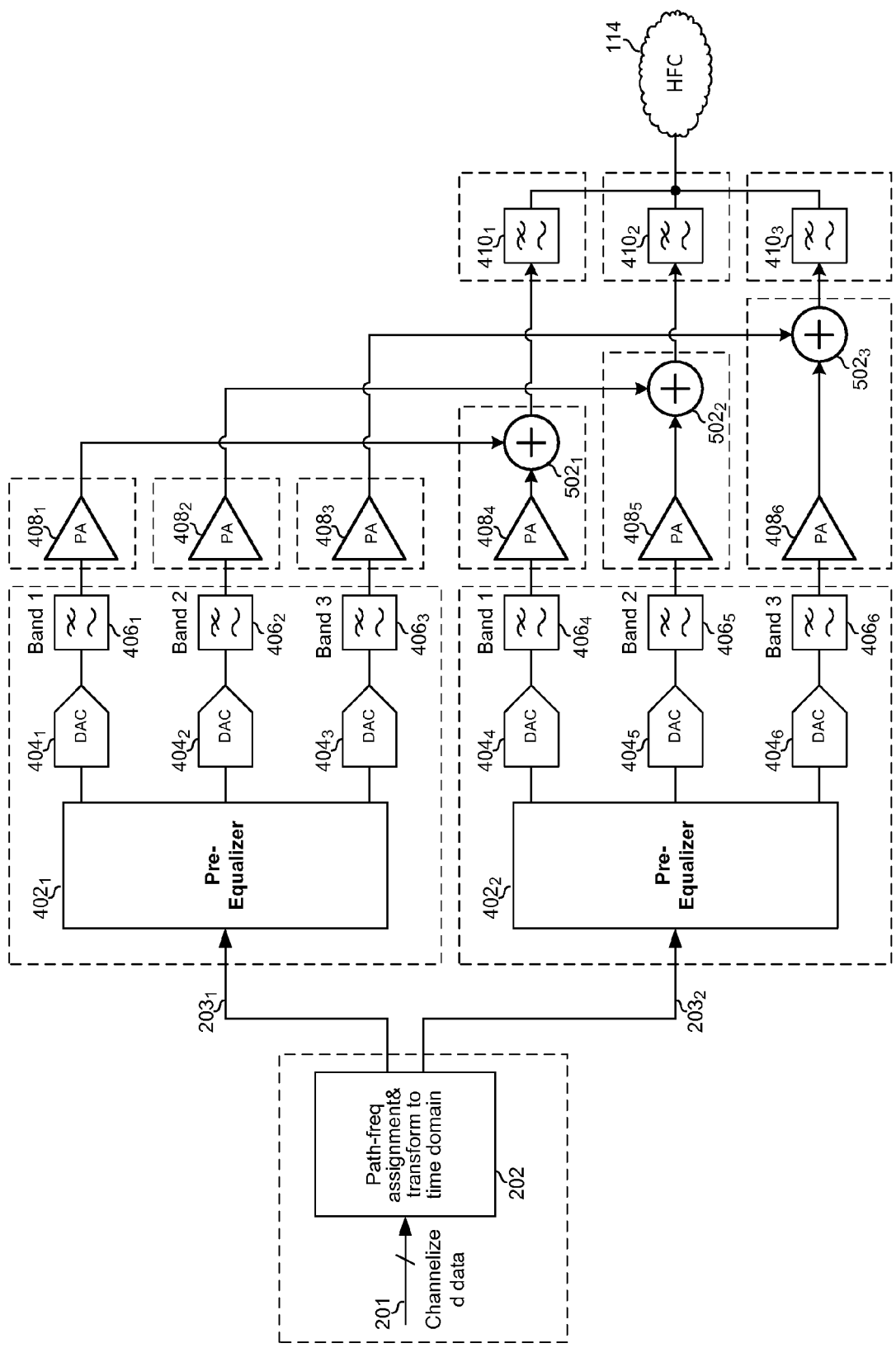
FIG. 5 depicts example system operable to dynamically allocate frequency segments among a pair of multiband transmitters.

FIG. 5 depicts example system operable to dynamically allocate frequency segments among a pair of multiband transmitters. For example, the transmitter architecture (or portion thereof) shown in FIG. 5 may comprise path assignment circuit 202 and two instances of the multiband architecture shown in FIG. 4A. The transmitter architecture shown in FIG. 5 may comprise two pre-equalizers $402_1$ and $402_2$, each of which coupled to three transmit paths, with each transmit path comprising a DAC (e.g., one of DACs $404_1$-$404_6$), a first filter (e.g., one of filters $406_1$-$406_6$), a PA (e.g., one of PAs $408_1$-$408_6$). Further, one or more second filters (e.g., filters $410_1$-$410_3$) may be used to provide filtering in the manner described with respect to FIG. 4A.

In the example implementation shown in FIG. 5, Band 1 output from first set of transmit paths may be combined with Band 1 output from second set of transmit paths via a circuit $502_1$. Similarly, Band 2 outputs may be combined by a circuit $502_2$, and Band 3 outputs may be combined by a circuit $502_3$. Each of the circuits $502_1$, $502_2$, and $502_3$ may be a passive or active combiner or circulator. The outputs of the circuits $502_1$, $502_2$, and $502_3$ may be input into corresponding one of the second filters $410_1$-$410_3$.

In various implementations, the transmitter shown in FIG. 5 may be realized in any combination of one or more integrated circuits and/or one or more discrete components residing on one or more printed circuit boards (PCBs). As just one example, each of the dashed rectangles in FIG. 5 may correspond to an integrated circuit or discrete element, and the integrated circuits and discrete elements may reside on one or more printed circuit boards (PCBs).

Figure 6:
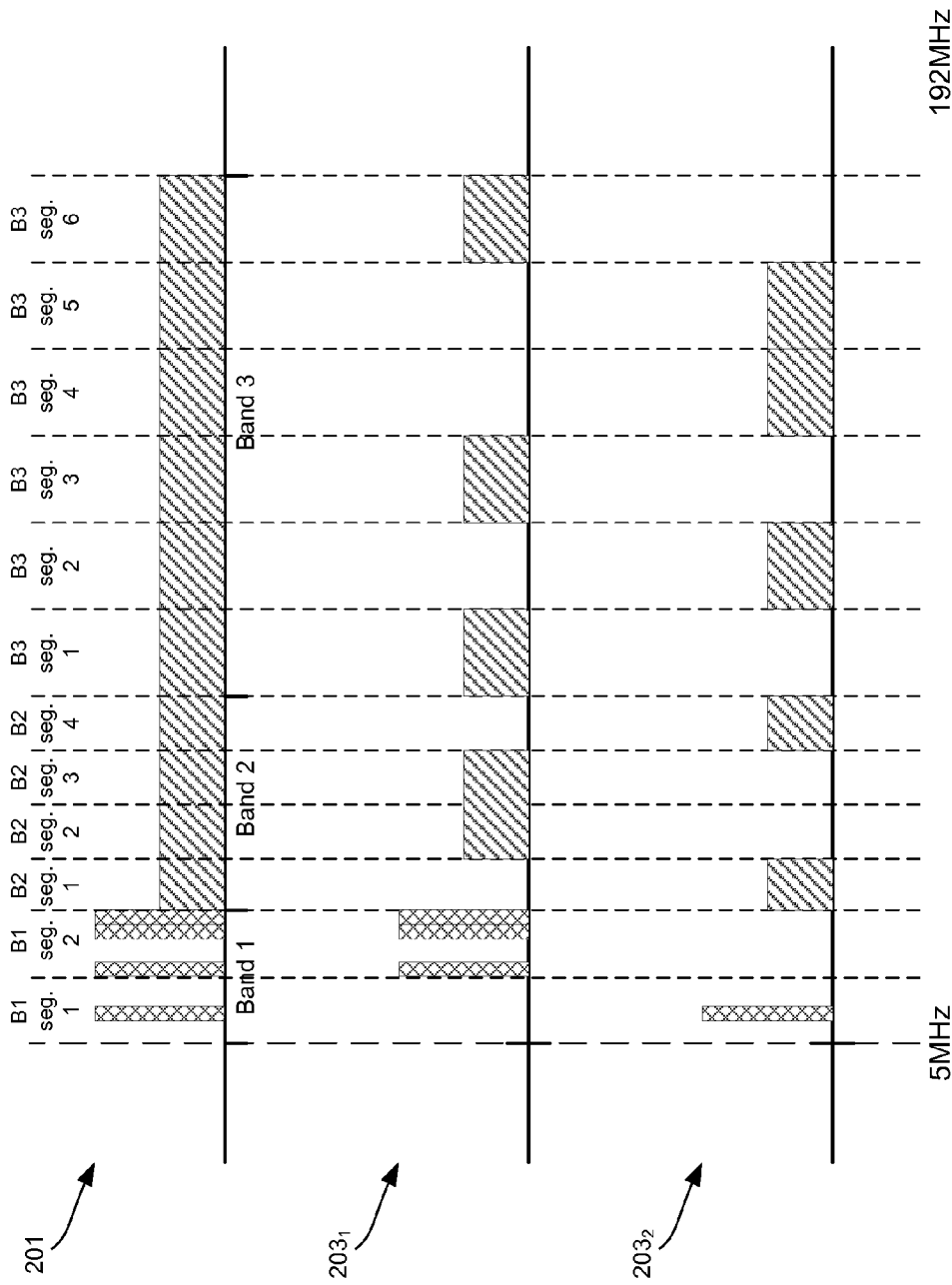
FIG. 6 depicts an example result of dynamic allocation of segments among multiband transmitters.

FIG. 6 depicts an example result of dynamic allocation of segments among the multiband transmitters, such as the pair of multiband transmitters of the transmitter architecture shown in FIG. 5. In FIG. 6, spectrum (e.g., corresponding to signals 201 input into the path assignment circuit 202) may be divided into twelve segments during spectrum allocation among the transmit paths in the transmitter shown in FIG. 5. In an example implementation, a different segment size (bandwidth) is used for each of the three bands, but this disclosure is not so limited. As a result of a random assignment of each of the twelve segments, segments B1_2, B2_2, B2_3, B2_1, B3_3, and B3_6 may be assigned to signal $203_1$ (input into pre-equalizer $402_1$) and segments B1_1, B2_1, B2_4, B3_2, B3_4, B3_5 may be assigned to signal $203_2$ (input into pre-equalizer $402_2$).

FIGS. 7A-7D depict example architectures for a transceiver comprising multiple transmit paths and multiple receive paths.

Figure 7A:
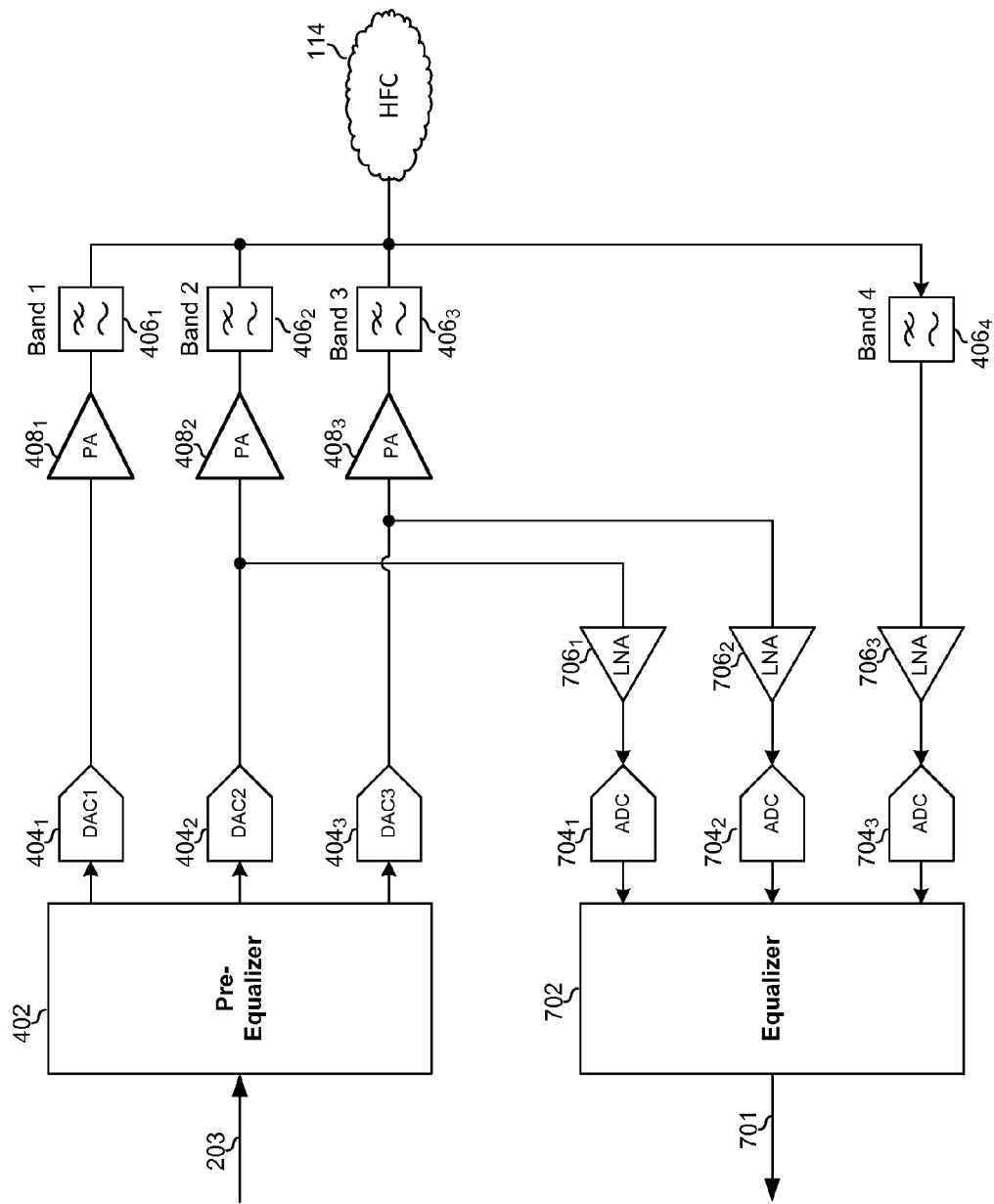
FIGS. 7A-7D depict example architectures for a transceiver comprising multiple transmit paths and multiple receive paths.
Figure 7B:
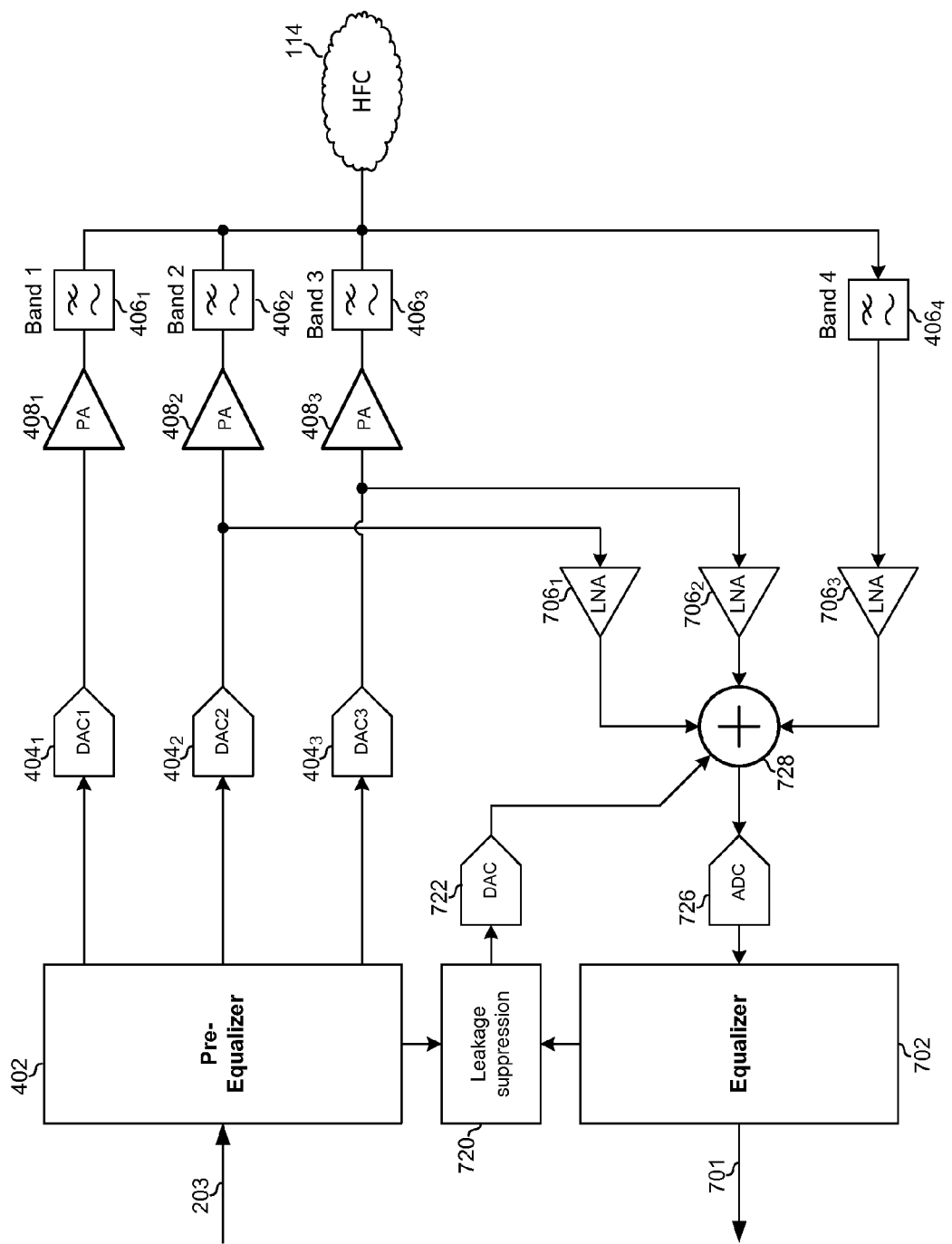
Figure 7C:
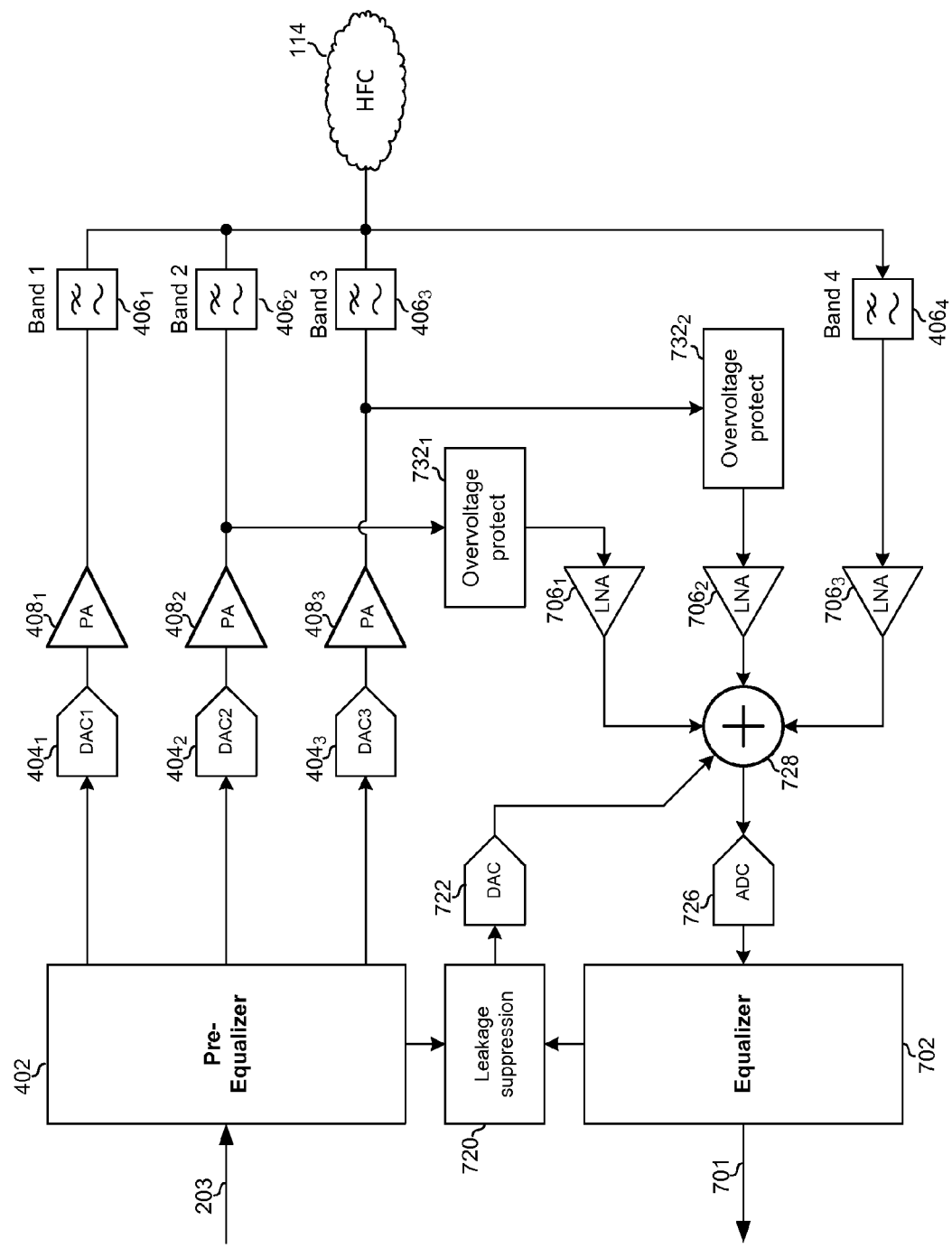
Figure 7D:
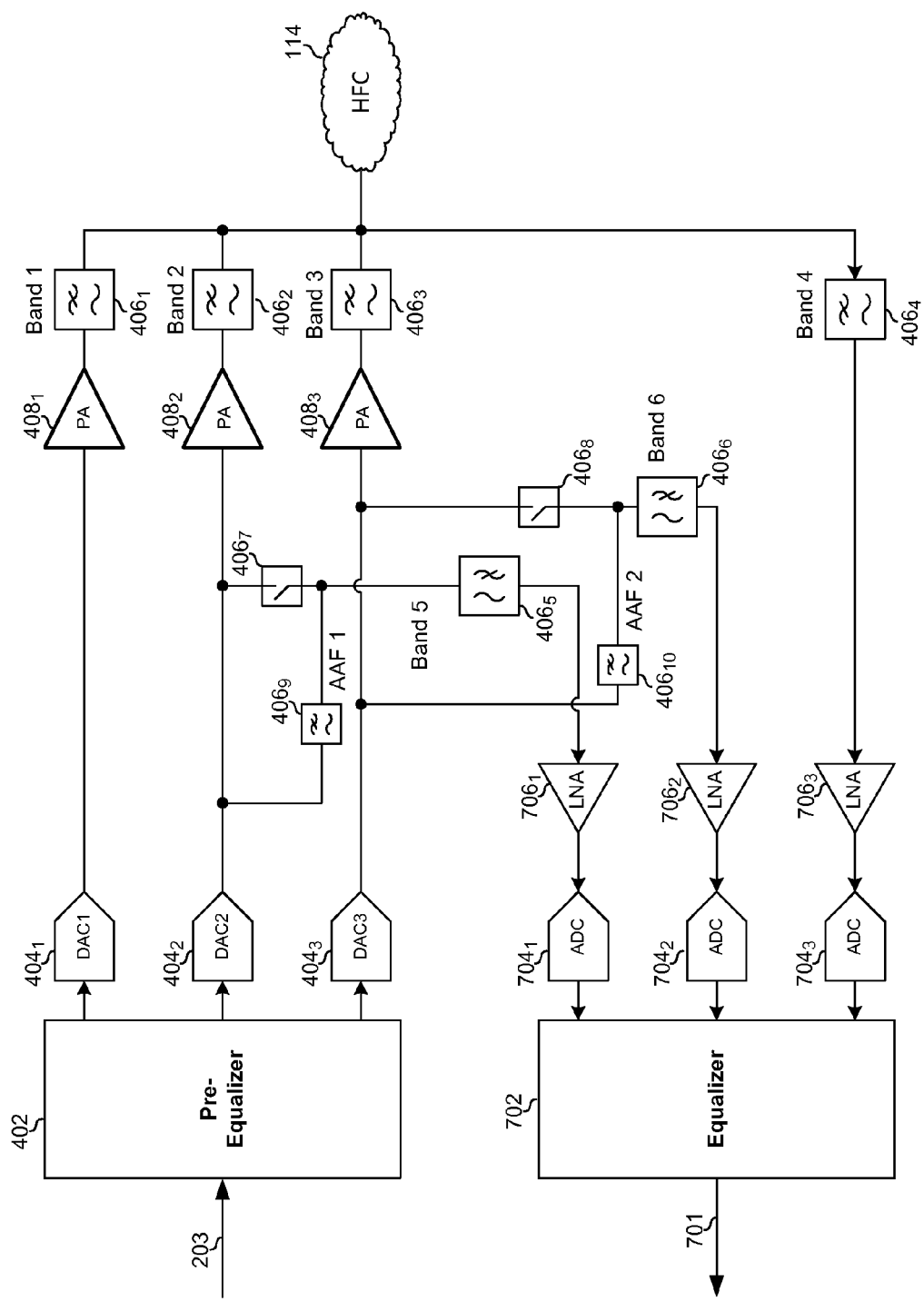

Each of the example architectures shown in FIGS. 7A-7D may comprise a multiband transmit subsystem, a multiband receive subsystem, a plurality of filters (e.g., filters $406_1$-$406_4$ in the example architectures shown in FIGS. 7A-7C; and filters $406_1$-$406_6$ in the example architecture shown in FIG. 7D), and network 114 (e.g., a HFC network). The multiband transmit subsystem may comprise, in each of the example architectures shown in FIGS. 7A-7D, pre-equalizer 402, DACs $404_1$-$404_3$, PAs $408_1$-$408_3$. The multiband transmit subsystem may vary among the example architectures shown in FIGS. 7A-7D. Each of the circuits shown in FIGS. 7A-7D and previously mentioned may be as described above.

In FIG. 7A, the example multiband receive subsystem may comprise an equalizer 702, analog-to-digital converters (ADCs) $704_1$-$704_3$, and low-noise amplifiers (LNAs) $706_1$-$706_3$. Also shown are filters $406_1$-$406_4$, where filters $406_1$-$406_3$ are shared by the transmitter subsystem and the receive subsystem, whereas filter $406_4$ is used only by the receive subsystem. The passbands of the filters $406_1$-$406_4$ may be the bands $412_1$-$412_4$ (corresponding to Bands 1 through 4), respectively, as shown in FIG. 8A.

In a first configuration, the transceiver of FIG. 7A may support transmit on Band 1 and receive on Bands 2, 3, and 4. In such a configuration, PA $408_1$ may be configured to amplify transmit signals, PAs $408_2$ and $408_3$ may be configured as short circuits (or may be bypassed via one or more switching elements) such that received signals from the filters $404_2$ and $406_3$ may pass through the PAs $408_2$ and $408_3$, and each of LNAs $706_1$-$706_3$ may be configured to amplify a respective received signal from filters $406_2$, $406_3$, and $406_4$. The output of each of LNAs $706_1$-$706_3$ may then be digitized by a respective one of ADCs $704_1$-$704_3$. The outputs of the ADCs may then be equalized by equalizer 702.

In a second configuration, the transceiver of FIG. 7A may support transmit on Bands 1 and 2 and receive on Bands 3 and 4. In such a configuration, PAs $408_1$ and $408_2$ may be configured to amplify respective transmit signals, PA $408_3$ may be configured as a short circuit (or may be bypassed via one or more switching elements) such that received signals from the filter $406_3$ may pass through the PA $408_3$, LNA $706_1$ may be powered down, and each of LNAs $706_2$-$706_3$ may be configured to amplify a respective one of received signals from filters $406_3$ and $406_4$. The output of the LNAs $706_2$ and $706_3$ may then be digitized by the ADCs $704_2$ and $704_3$ and then equalized by equalizer 702.

In a third configuration, the transceiver of FIG. 7A may support transmit on Bands 1, 2, and 3 and receive on a fourth band $412_4$ ("Band 4.") In such a configuration, PAs $408_1$-$408_3$ may be configured to amplify respective transmit signals, LNAs $706_1$-$706_2$ may be powered down, and LNA $706_3$ may be configured to amplify received signals from filter $406_4$. The output of the LNA $706_3$ may then be digitized by the ADC $704_3$ and then equalized by equalizer 702. Equalizer 702 may also be operable to filter out-of-band noise from LNAs $706_1$-$706_3$.

The configurability of the PAs into a short circuit may eliminate the need for switches (a source of loss) in the upstream and downstream paths.

In FIG. 7B the example multiband receive subsystem comprises the equalizer 702, the low-noise amplifiers (LNAs) $706_1$-$706_3$, a leakage suppression circuit 720, a DAC 722, an ADC 726, and a combiner 728.

The transceiver of FIG. 7B may support the same configurations of LNAs and PAs as described above with respect to FIG. 7A. Rather than applying outputs of the LNAs $706_1$-$706_3$ to the equalizer 704 through respective and dedicated ADCs (e.g., the ADCs $704_1$-$704_3$ in FIG. 7A), the outputs of the LNAs $706_1$-$706_3$ may be instead combined via the combiner 728, and may then be applied through a single ADC—e.g., the ADC 726. The combiner 728 may be, for example, a passive or active combiner or circulator. Further, the leakage suppression circuit 720 may be operable to cancel out effects of overlap in the passbands of the filters $406_1$-$406_4$ and/or non-idealities in the received signals, similar to how the pre-equalizer compensates for such overlaps and non-idealities for transmitted signals. For example, the digital output of the leakage suppression circuit 720 may be converted to analog via the DAC 722, and may then be combined with the outputs of the LNAs $706_1$-$706_3$ via the combiner 728.

In FIG. 7C the example multiband receive subsystem comprises the equalizer 702, the ADC 726, combiner 728, the LNAs $706_1$-$706_3$, the leakage suppression circuit 720, DAC 722, and overvoltage protection circuits $732_1$ and $732_2$.

In a first configuration, the transceiver of FIG. 7C may support transmit on Band 1 and receive on Bands 2, 3, and 4. In such a configuration, PA $408_1$ may be configured to amplify transmit signals, PAs $408_2$ and $408_3$ may be configured as open circuits so as not to load down or interfere with signals received via the filters $406_2$ and $406_3$ which then pass through the circuits $732_1$ and $732_2$, for amplification by LNAs $706_1$ and $706_2$.

In a second configuration, the transceiver of FIG. 7C may support transmit on Bands 1 and 2 and receive on Bands 3 and 4. In such a configuration, PAs $408_1$ and $408_2$ may be configured to amplify respective transmit signals, PA $408_3$ may be configured as an open circuit so as not to load down or interfere with signals received via the filters $406_3$ which then pass through the circuit $732_2$, for amplification by LNAs $706_2$. In this configuration, LNA $706_1$ may be disabled and may be protected being damaged by the output of PA $408_2$ by circuit $732_1$.

In a third configuration, the transceiver of FIG. 7C may support transmit on Bands 1, 2, and 3 and receive on Band 4. In such a configuration, PAs $408_1$-$408_3$ may be configured to amplify respective transmit signals, LNAs $706_1$-$706_2$ may be disabled and may be protected by circuits $732_1$ and $732_2$.

Shown in FIG. 7D is an example multiband receive subsystem similar to the embodiment shown in FIG. 7A, but additionally including filters $406_5$ and $406_6$, and switches $406_7$ and $406_8$. The filters $406_5$ and $406_6$ may be configured based on spectrum allocation that accommodate sharing circuitry between transmit and receive paths. For example, the passbands of the filters $406_5$ and $406_6$ may be bands $412_5$ and $412_6$ respectively, as shown in FIG. 8B. The filters $406_5$ and $406_6$ may provide additional (relative to the embodiment of FIG. 7A) filtering of undesired signals through bands $412_5$ and $412_6$ respectively, while allowing filters $406_2$ and $406_3$ to be designed with greater flexibility (relative to the embodiment of FIG. 7A). Switches $406_7$ and $406_8$ may be dynamically configurable during operation of the transceiver to couple and decouple the receive subsystem from the transmit subsystem as desired/necessary. Furthermore, when Band 2 and Band 3 are used for filtering received signals, DACs $404_2$ and $404_3$ may drive filters $406_9$ and $406_m$ respectively in order to cancel or otherwise suppress undesired signals. This may avoids the need to add additional component, such as a separate DAC (e.g., DAC 722 of FIGS. 7B and 7C).

Although each of FIGS. 7A-7D depict only a single transmit subsystem, there may be two such subsystem in parallel and fed by circuit 202, substantially in the similar manner as described with respect to the architecture shown in such as in FIG. 5 for example.

In FIGS. 7A-7C, the use of four narrower-band filters instead of two (one for Bands 1, 2, and 3) or one (one for all bands) wider-band filter may reduce cost and complexity. Additionally, the depicted filter configuration may suppress noise and/or distortion (e.g., harmonic distortion generated by the PAs, noise created by the DACs, and/or distortion introduced by the DACs) that falls in both the upstream and downstream paths, which may enable reducing the cost and complexity of the PAs and the DACs.

In various implementations, the components of each of the transceivers shown in FIG. 7A-7C may be realized in any combination of one or more integrated circuits and/or one or more discrete components residing on one or more printed circuit boards (PCBs). As just one example, in FIG. 7C, the components 402, 404, 720, 702, 722, 726, 728, and 706 may reside on a first semiconductor (e.g., silicon) die, $408_1$ may reside on a second semiconductor (e.g., Gallium Arsenide) die, $408_2$ and $732_1$ may reside on a third semiconductor (e.g., Gallium Arsenide) die, $408_3$ and $732_2$ may reside on a fourth semiconductor (e.g., Gallium Arsenide) die and the filters $406_1$-$406_4$ may be discrete components. As another example, in FIG. 7C, the circuits 732 may be on-chip with the LNAs 706. As another example, in FIG. 7C, the components 402, 404, 720, 702, 722, 726, and 728 may reside on a first semiconductor die; $408_1$, $706_1$, and $732_1$ may reside on a second die; $408_2$, $706_2$, and $732_2$ may reside on a third die, $408_3$ and $706_3$ may reside on a fourth die, and the filters $406_1$-$406_4$ may reside on a fifth die. Any other partitioning is possible.

FIG. 8A depicts an example allocation of spectrum among paths of the transceivers shown in FIGS. 7A-7C.

In an example implementation, Band 1 may be ~5 MHz to ~42 MHz, Band 2 may be ~42 MHz to ~85 MHz, Band 3 may be ~85 MHz to ~192 MHz, and Band 4 may be approximately 200 MHz to ~1003 MHz. In such an implementation, for DOCSIS 3.0 or DOCSIS 3.1 with a "low split," the transceiver may be configured into configuration 1 described above, for DOCSIS 3.1 with a "mid split," the transceiver may be configured into configuration 2 described above, for DOCSIS 3.1 with a "high split" the transceiver may be configured into configuration 3 described above.

FIG. 8B depicts an example allocation of spectrum among transmit and receive paths of the transceivers shown in FIG. 7D. In an example implementation, bands $412_5$ and $412_6$ may be allocated in addition to the other bands allocated as described in FIG. 8A. In this regard, the bands $412_5$ and $412_6$ may be allocated such that may be used as passbands of the filters $406_5$ and $406_6$. Bands $412_5$ and $412_6$ may be allocated, for example, when circuitry is shared between transmit and receive path in the transceivers, with some of shared circuitry in the same paths is assigned other allocated bands. For example, bands $412_5$ and $412_6$ may be determined and/or allocated based on bands $412_2$ and $412_3$, which may be used as passbands of the filters 406₂ and 406₃ that are part of the receive paths that use filters 406₅ and 406₆, respectively.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
   one or more assignment circuits operable to assign, to a plurality of transmit paths in a transmitter, a plurality of segments of a frequency spectrum that is used for transmission of signals;
   a control circuit operable to:
      monitor performance in each of the plurality of transmit paths during transmission of signals, based on peak to average power ratio (PAPR) and/or spectrum usage; and
      when said monitored performance meets one or more particular conditions, generate a feedback control signal for adjusting operation of the one or more assignment circuits; and
   wherein the one or more assignment circuits are operable to dynamically modify, based on said feedback control signal, one or both of segmentation of the frequency spectrum and assignment of the plurality of segments to the plurality of transmit paths.

2. The system of claim 1, wherein each of the plurality of transmit paths comprises one or more of: a digital-to-analog convertor (DAC) circuit, a power amplifier (PA) circuit, and a filter circuit.

3. The system of claim 1, wherein the one or more assignment circuits are operable to modify, based on said monitored performance, operation of a particular transmit path from the plurality of transmit paths.

4. The system of claim 3, wherein modifying the operation of said particular transmit path comprises disabling or enabling said particular transmit path.

5. The system of claim 1, wherein the one or more assignment circuits are operable to segment the frequency spectrum such that each of the plurality of segments is uniformly sized.

6. The system of claim 1, wherein the one or more assignment circuits are operable to segment the frequency spectrum such that at least one of the plurality of segments is sized differently than at least another one of the plurality of segments.

7. The system of claim 1, wherein the one or more assignment circuits are operable to segment the frequency spectrum to maintain compliance and/or compatibility with one or more protocols or standards applicable to said transmission.

8. The system of claim 1, wherein the control circuit is operable to monitor performance in each of the plurality of transmit paths based on use of one or more performance related criteria.

9. The system of claim 8, wherein said one or more performance related criteria comprise a threshold value or a timeout duration.

10. A method comprising:
    in a transmitter that comprises a plurality of transmit paths:
       assigning to the plurality of transmit paths a plurality of segments of a frequency spectrum that is used for transmission of signals;
       monitoring performance in each of the plurality of transmit paths during transmission of signals, based on peak to average power ratio (PAPR) and/or spectrum usage;
       generating, when said monitored performance meets one or more particular conditions, a feedback control signal for adjusting said assigning; and
       dynamically modifying, based on said feedback control signal, one or both of segmentation of the frequency spectrum and assignment of the plurality of segments to the plurality of transmit paths.

11. The method of claim 10, comprising modifying, based on said monitored performance, operation of a particular transmit path from the plurality of transmit paths.

12. The method of claim 11, wherein modifying the operation of said particular transmit path comprises disabling or enabling said particular transmit path.

13. The method of claim 10, comprising segmenting the frequency spectrum such that each of the plurality of segments is uniformly sized.

14. The method of claim 10, comprising segmenting the frequency spectrum such that at least one of the plurality of segments is sized differently than at least another one of the plurality of segments.

15. The method of claim 10, comprising segmenting the frequency spectrum to maintain compliance and/or compatibility with one or more protocols or standards applicable to said transmission.

16. The method of claim 10, comprising monitoring performance in each of the plurality of transmit paths based on use of one or more performance related criteria.

17. The method of claim 16, wherein said one or more performance related criteria comprise a threshold value or a timeout duration.

* * * * *